United States Patent [19]

Cloutier et al.

[11] Patent Number: 5,418,460

[45] Date of Patent: May 23, 1995

[54] COMPACT TRIAXIAL AC MAGNETIC FIELD ANALYZER/DOSIMETER USING SWEPT BANDPASS FILTERS

[75] Inventors: Paul A. Cloutier; Delbert R. Oehme, both of Houston, Tex.

[73] Assignee: Innovatum, Inc., Houston, Tex.

[21] Appl. No.: 915,660

[22] Filed: Jul. 21, 1992

[51] Int. Cl.[6] .......................... G01R 33/02; G01B 7/14
[52] U.S. Cl. ................. 324/247; 324/207.17; 324/260; 33/361
[58] Field of Search .............. 324/247, 207.17, 207.16, 324/207.15, 244, 246, 245, 260, 77 R, 77 CS, 77 B, 253–255, 76.12, 76.27, 76.19; 33/361; 364/481, 572; 340/870.3, 87.36

[56] References Cited

U.S. PATENT DOCUMENTS

| | | | |
|---|---|---|---|
| 3,641,515 | 2/1972 | Sues | 340/173 |
| 3,781,664 | 12/1973 | Rorden | 324/247 |
| 4,109,199 | 8/1978 | Ball et al. | 324/202 |
| 4,198,596 | 4/1980 | Waeselynck et al. | 324/344 |
| 4,238,727 | 12/1980 | Madni | 324/77 |
| 4,242,732 | 12/1980 | Campbell | 364/485 |
| 4,303,979 | 12/1981 | Kato et al. | 364/485 |
| 4,314,251 | 2/1982 | Raab | 324/247 X |
| 4,362,992 | 12/1982 | Young et al. | 324/247 |
| 4,492,923 | 1/1985 | Byram | 324/247 X |
| 4,635,207 | 1/1987 | Payne | 364/484 |
| 4,656,750 | 4/1987 | Pitt et al. | 33/352 |
| 4,678,990 | 7/1987 | Bicknell et al. | 324/158 |
| 4,685,065 | 8/1987 | Braun et al. | 364/485 |
| 4,829,250 | 5/1989 | Rotier | 324/247 X |
| 4,839,583 | 6/1989 | Takano et al. | 324/77 |
| 4,890,237 | 12/1989 | Bales et al. | 364/485 |
| 4,975,633 | 12/1990 | Toda et al. | 324/77 |
| 5,010,653 | 4/1991 | Fowler | 33/356 |
| 5,151,649 | 9/1992 | Héroux | 324/247 X |
| 5,168,222 | 12/1992 | Volsin et al. | 324/247 X |

*Primary Examiner*—Sandra L. O'Shea
*Assistant Examiner*—Warren S. Edmonds
*Attorney, Agent, or Firm*—Shapiro and Shapiro

[57] ABSTRACT

A triaxial AC magnetic field analyzer/dosimeter instrument measures the field strength of three mutually orthogonal AC magnetic field components at a plurality of different frequencies in a frequency range of interest and stores corresponding data which may be processed to indicate the field strength at each of the frequencies and/or the sum of the field strengths over the frequency range of interest. The instrument is computer controlled and comprises three measurement channels corresponding to respective magnetic field components, each channel including a sensor coil, a clock controlled, switched capacitor, bandpass filter, and a TRMS detector. The passband of each filter is swept across the desired frequency range by a varying frequency clock.

13 Claims, 7 Drawing Sheets

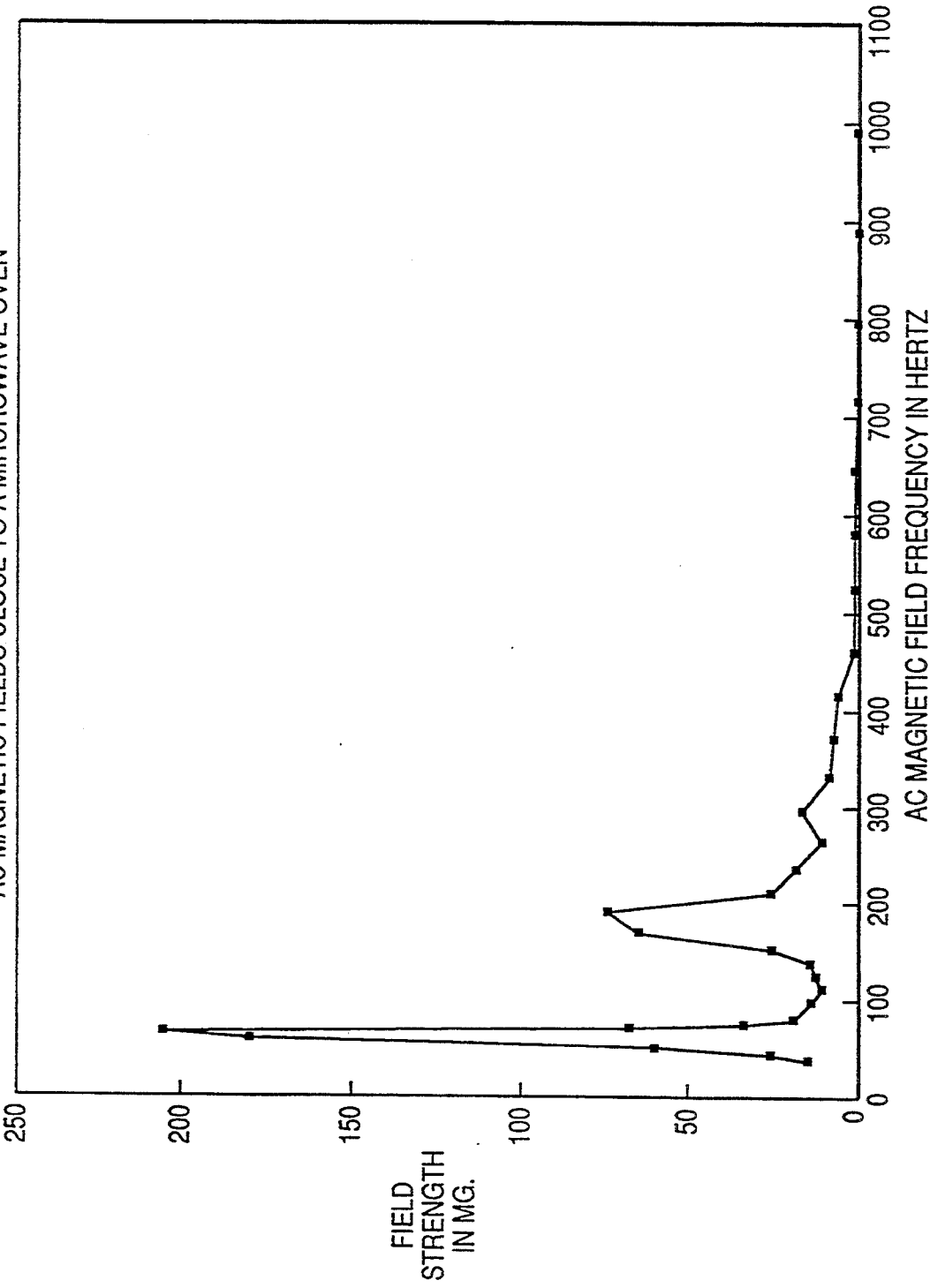

COMPACT TRIAXIAL AC MAGNETIC FIELD ANALYZER/DOSIMETER USING SWEPT BANDPASS FILTERS

SPECIFICATION

This invention is concerned with the measurement of AC magnetic fields, and more particularly with the measurement of AC magnetic field spectra.

BACKGROUND OF THE INVENTION

In recent years there has been increasing concern with the effects of AC magnetic fields on the human body. Such fields are associated with a wide variety of electrical apparatus, including, for example, power lines, transformers, electric blankets, computer monitors, and microwave ovens. However, there has been no practical instrument available for the measurement of such fields.

BRIEF DESCRIPTION OF THE INVENTION

The present invention provides, for the first time, a compact, highly portable instrument, capable of fitting a shirt pocket or being clipped on a belt, for analyzing and totalizing an AC magnetic field environment into which the instrument is carried.

More particularly, the invention provides a triaxial AC magnetic field spectrum analyzer/dosimeter for measuring and storing an AC magnetic field spectrum over a desired frequency range of, for example, 40 Hz to 1000 Hz. An individual spectrum can be measured and stored in a short period of time, e.g., about 45 seconds, and can later be analyzed for specific magnetic field frequencies, amount of activity at particular frequencies, and the total dose over the frequency range of interest. AC magnetic field strengths of from 0.2 to 375 milligauss, for example, can be measured.

BRIEF DESCRIPTION OF THE DRAWINGS

The invention will be further described in conjunction with the accompanying drawings, which illustrate a preferred (best mode) embodiment and wherein:

FIGS. 6 and 7 are diagrams illustrating measured AC magnetic field spectra.

DETAILED DESCRIPTION OF THE INVENTION

Figure 1:
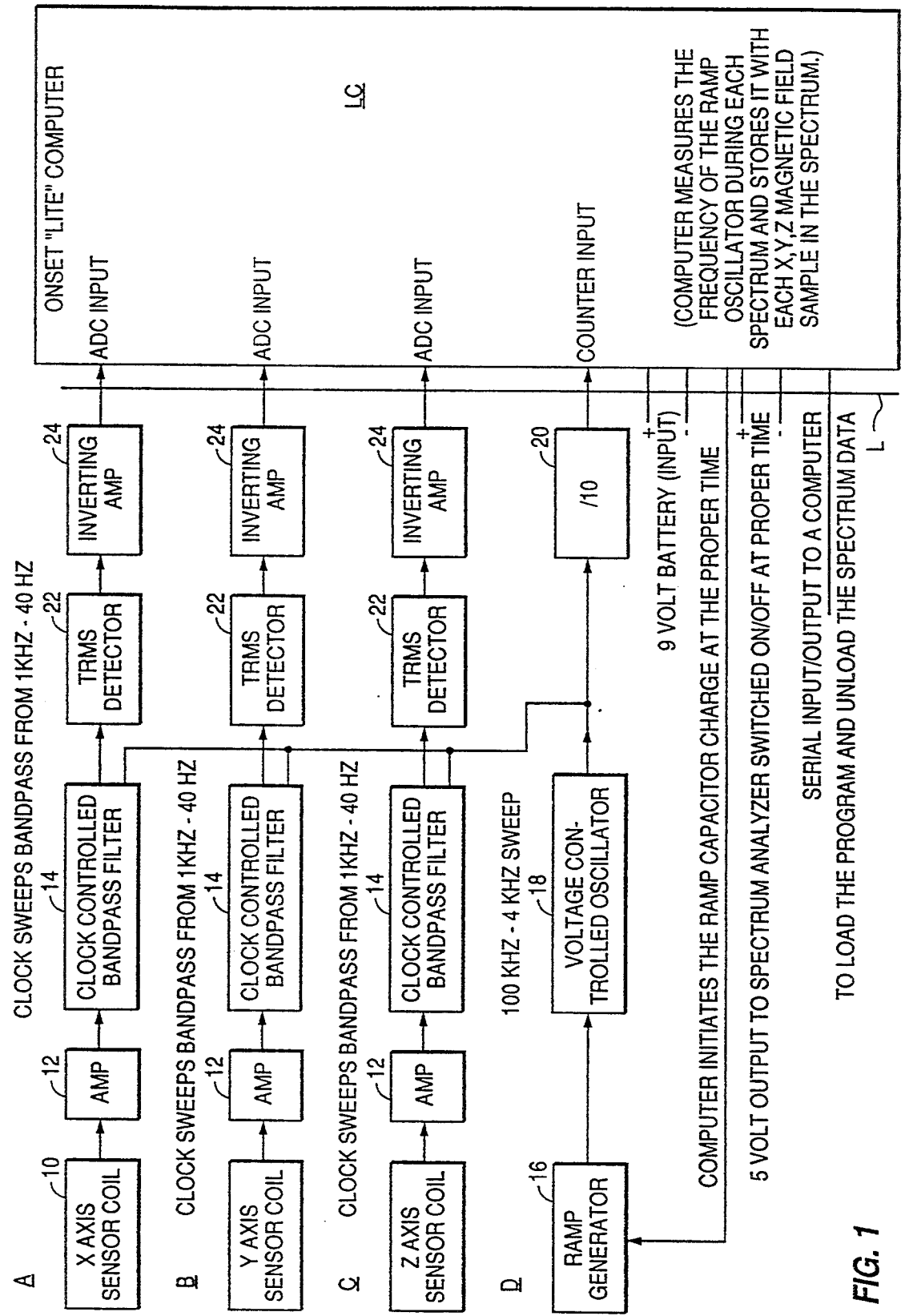
FIG. 1 is a block diagram of an instrument in accordance with the invention.

As shown in FIG. 1, an instrument in accordance with the invention comprises three measurement channels A, B, C and a frequency setting circuit D connected to a small low power data logging computer LC, such as the Tattletale "Lite" Data Logger of the Onset Computer Corp., N. Falmouth, Mass. This computer has 512 KB of RAM memory, an 8 channel analog-to-digital converter, 8 digital I/O ports, and a serial interface for loading programs and unloading data to an outside computer.

Figure 2A:
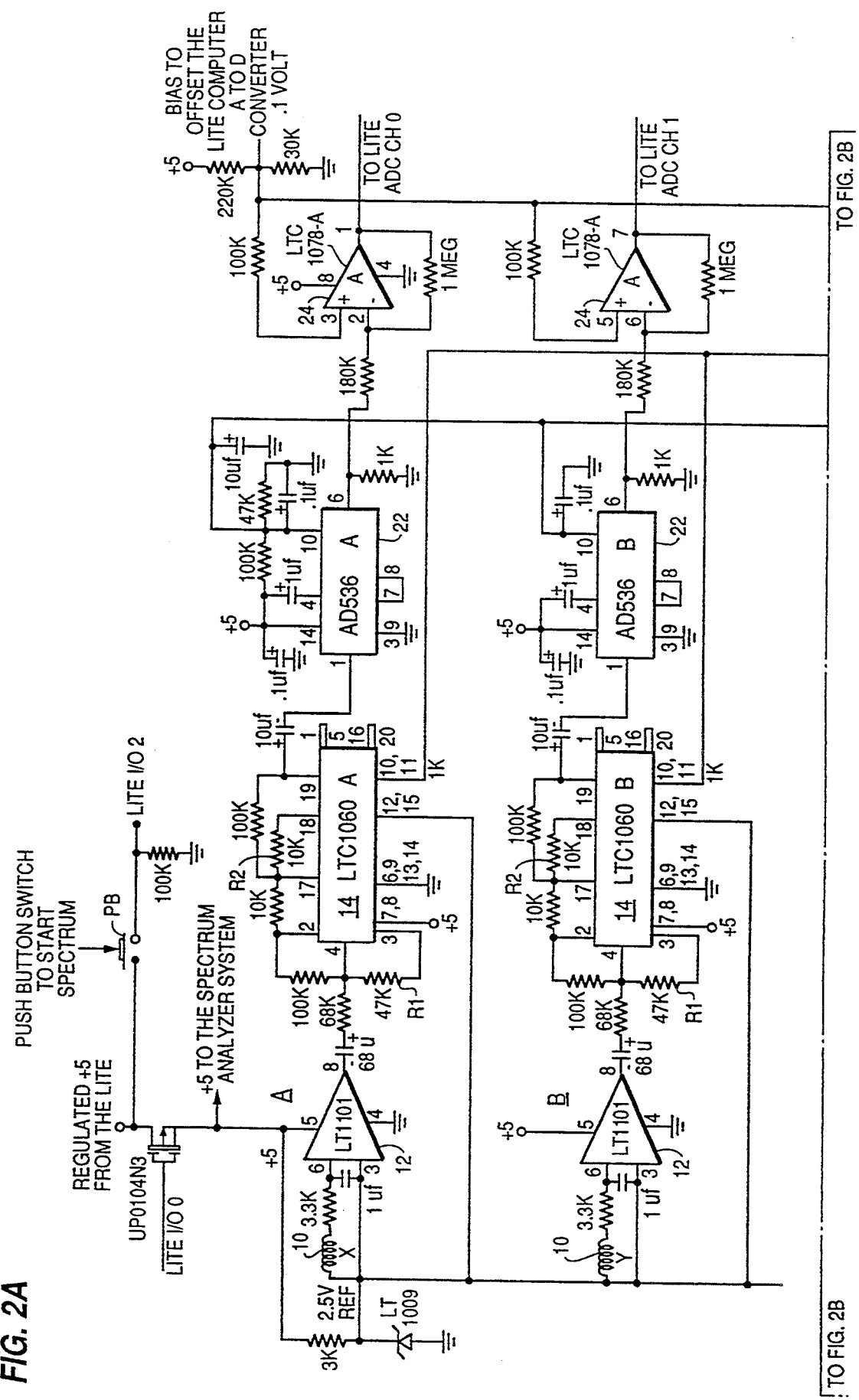
FIG. 2 (comprising FIGS. 2A and 2B) is a schematic diagram of a major portion of the instrument.
Figure 2B:
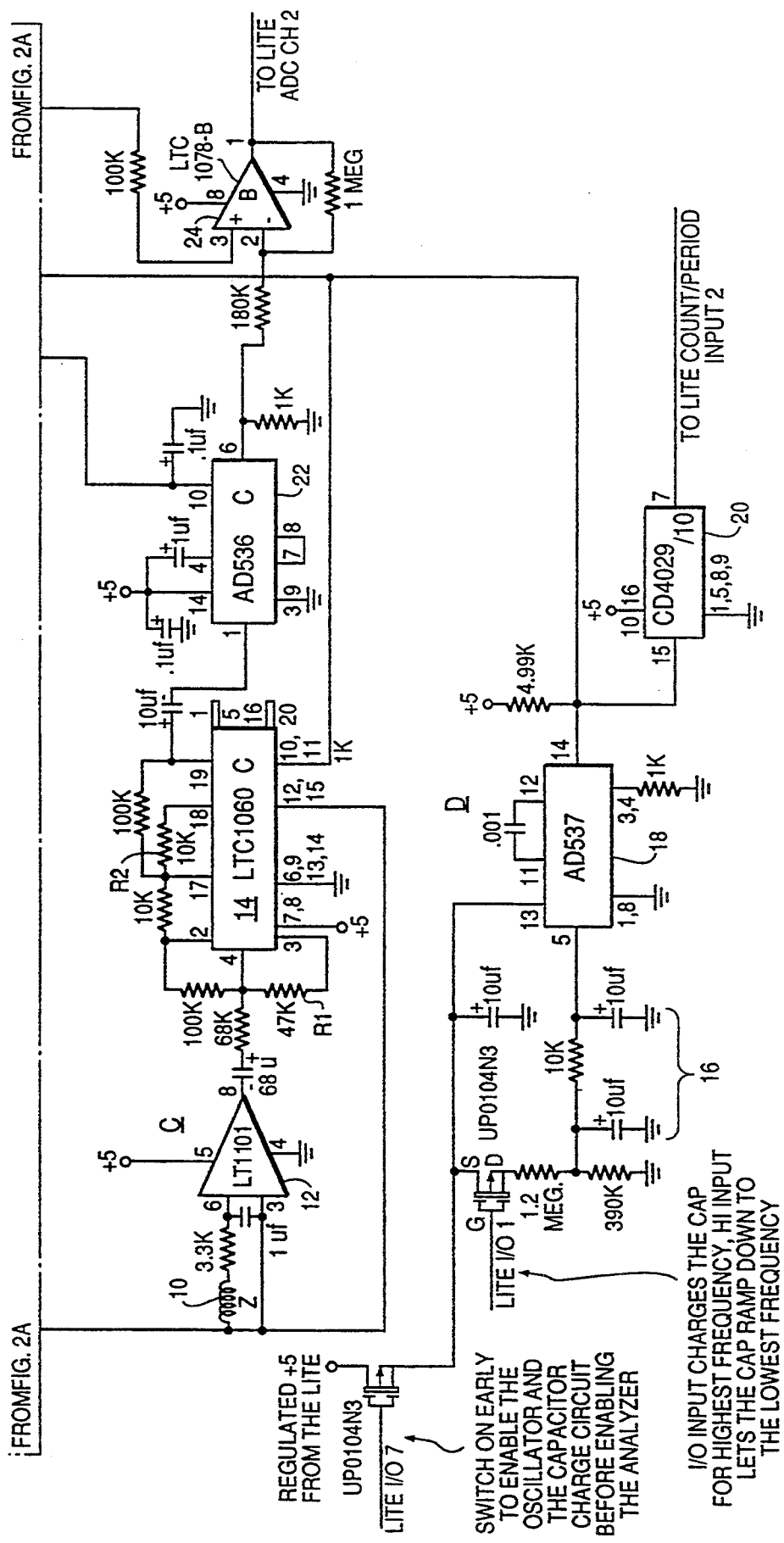

Each measurement channel includes a sensor coil 10, e.g, 2400 turns of No. 36 gauge wire wound on a PVC cylindrical post ($\frac{1}{8}$" diameter with $\frac{1}{2}$"×$\frac{1}{2}$" PVC end plates). The three sensor coils are disposed along X, Y and Z axes, respectively, and are mounted orthogonally. In the preferred embodiment of the invention, the entire instrument (including the computer) forms a package that is 2.36×4.71×1.0 in., i.e., slightly larger than a king size pack of cigarettes. The components shown in FIG. 1 to the left of line L are shown in FIG. 2 in greater detail and are mounted on a circuit board housed within the case of the instrument.

AC magnetic field signals sensed by the sensor coils 10 are amplified by amplifiers 12 and fed to clock controlled, switched capacitor, bandpass filters 14. Such filters are well known in the art. See, for example, Maxim Engineering Journal, Vol. 2, published by Maxim Integrated Products of Sunnyvale, Calif. The filters shown in FIG. 2 are Linear Technology LTC 1060. These filters transfer "buckets" of charge per clock cycle and amplify and bandpass with a center frequency at 1/100 of the filter clock frequency.

The filter clock frequency is supplied from the frequency setting circuit D, that includes a ramp generator 16 and a voltage controlled oscillator 18. The voltage controlled oscillator is a voltage-to-frequency converter which outputs a frequency range of 100 KHz to 4 KHz during the rundown time of the ramp generator, which is an RC network charged at the beginning of each spectrum sweep. The output of the voltage controlled oscillator is connected to a counter input of the computer LC via a divide-by-ten circuit 20 and is monitored by the computer.

The output of each bandpass filter 14 is fed to a TRMS (total root mean square) detector 22, which converts the output of the bandpass filter to DC. The output of each TRMS detector is supplied, through an inverting DC amplifier 24, to an analog-to-digital converter input of the computer LC.

Figure 3:
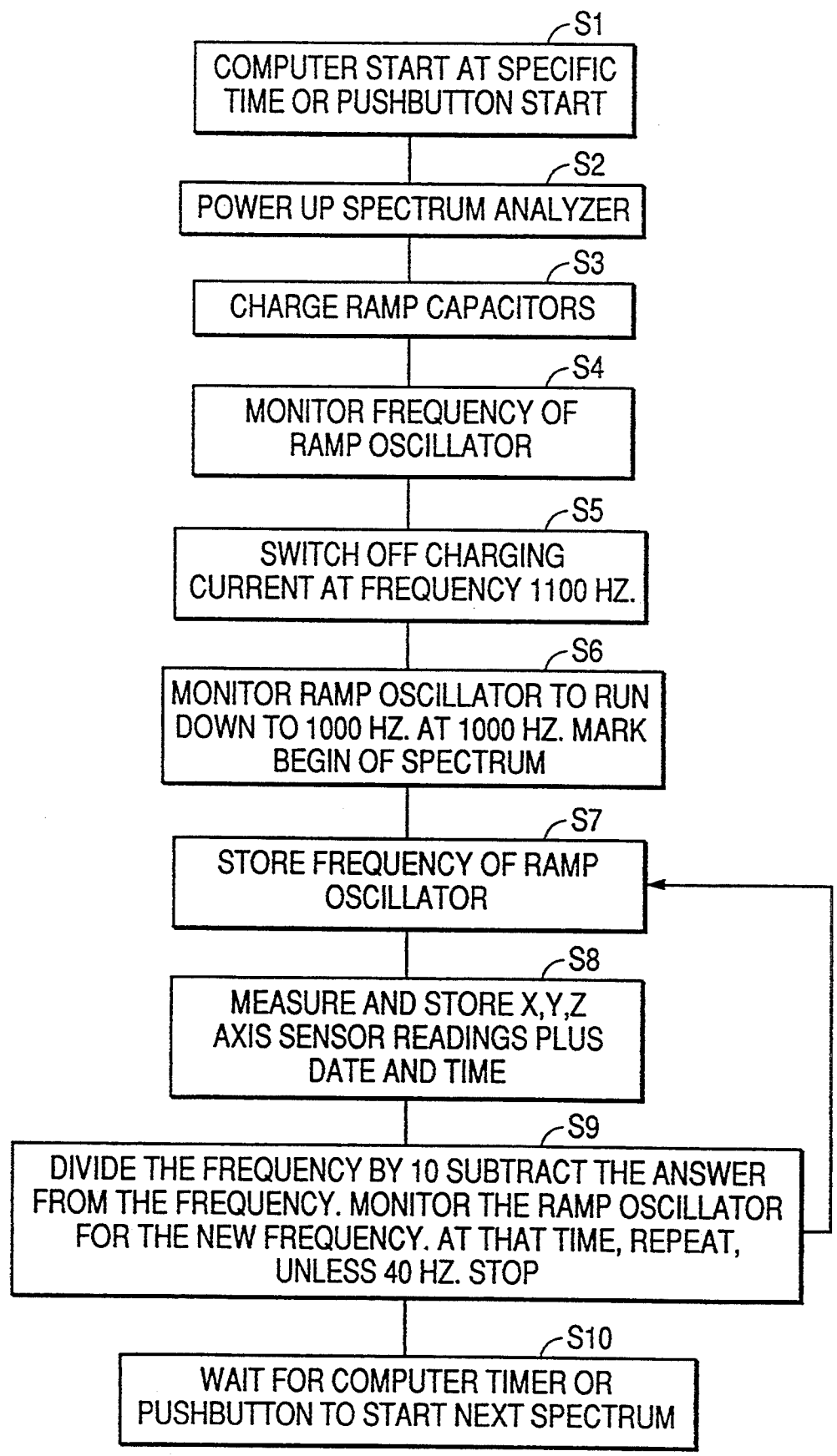
FIG. 3 is a flow chart illustrating data gathering in accordance with the invention.

As shown in FIG. 3, the instrument of the invention performs a spectrum gathering process as follows:

A command to take a spectrum (step S1) is given either by pushing an initiate spectrum button PB shown in FIG. 2 or by a time driven command from a computer program that has been loaded into the computer LC via the serial input/output port. The computer then supplies power (step S2), e.g., 5 volts DC, to the spectrum analyzer components shown to the left of line L in FIG. 1 and shown in greater detail in FIG. 2. Then the computer initiates a ramp capacitor charge (step S3), charging the capacitors of the ramp generator 16, the voltage of which is converted to a frequency by the voltage controlled oscillator 18, which is monitored by the computer (step S4). When the frequency reaches a programmed point, e.g., 1100 Hz, the RC charging stops (step S5), and an RC rundown begins. When the rundown reaches 1000 Hz, the instrument starts the measurement of a spectrum (step S6). At that point, the computer stores the frequency of the oscillator 18 divided by ten (step S7), samples the output of the three measurement channels and stores these measurements in computer memory, along with the date/time of the sample, provided by an internal computer date/time generator (step S8).

The RC discharge is continuous, and the corresponding frequency is monitored by the computer. At a frequency which corresponds to one-half of the filter bandwidth (3db points) for the sample just measured, another sample is taken of the output of all three measurement channels and is stored in computer memory, along with the date/time. This process is continued until the lower end of the spectrum is reached (step S9). As indicated in step S9, the frequency at which each sample (subsequent to the first) is to be taken is determined by dividing by ten the frequency of the voltage controlled oscillator at which the previous sample was taken and subtracting the answer from the previous frequency. Then the computer turns off the power to the instrument and awaits a command to measure the next spectrum (step S10).

Figure 4:
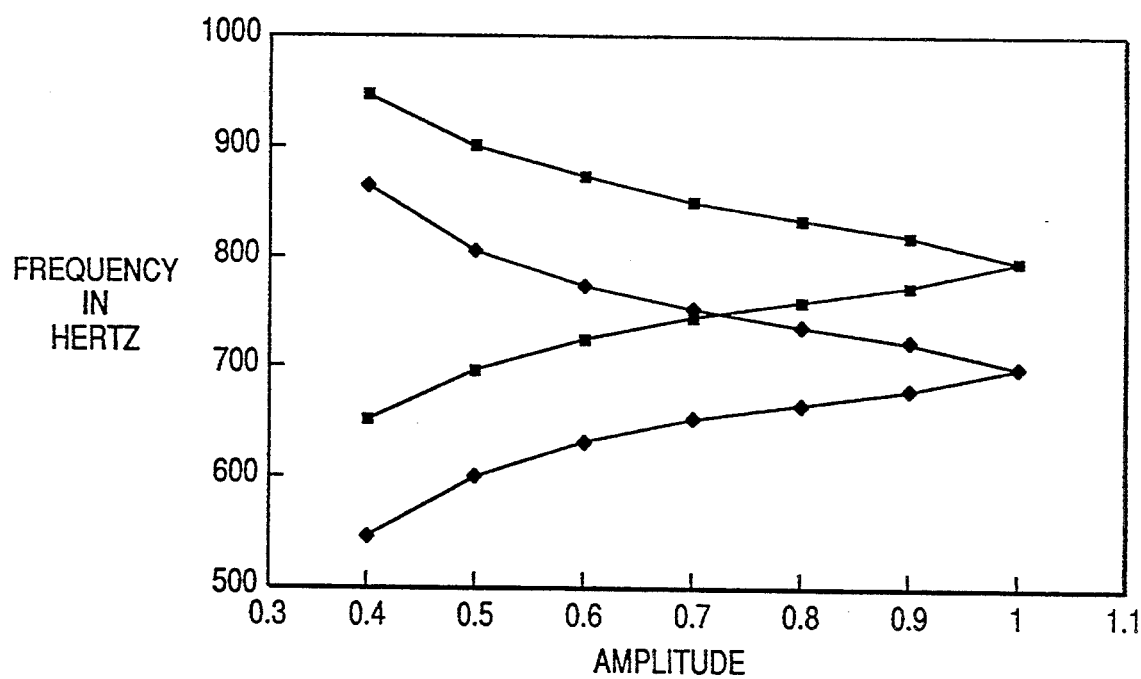
FIGS. 4 and 5 are diagrams illustrating passband characteristics of filters used in the invention, at different portions of a frequency spectrum.
Figure 5:
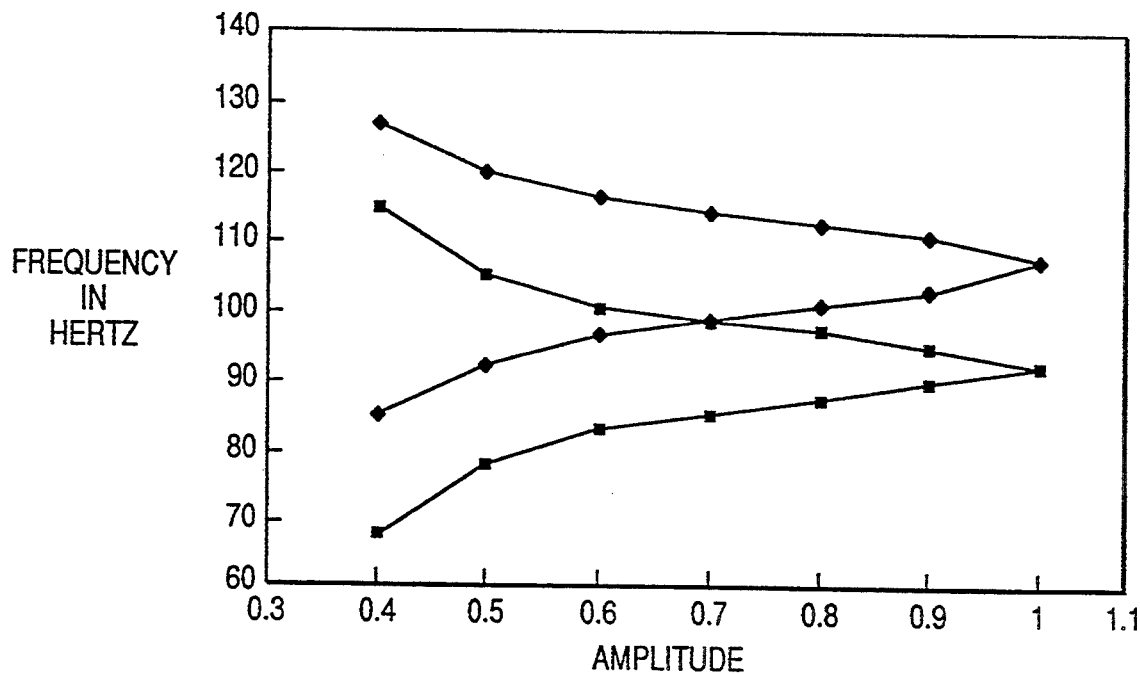

Each spectrum measurement takes 30 frequency samples across a range of 40 Hz to 1000 Hz, for example. Each frequency "bin" is aligned with the adjacent frequency "bin" so that their passbands intersect at their 3db rolloff points. The filter "Q", which is set by the resistors R1 and R2 in FIG. 2, is constant across the frequency spectrum, so that the bandwidth is narrower at the lower frequencies (Q=f/bw). See FIGS. 4 and 5. The filter "Q" may be set to about 9. Thus, at the high frequency end of the spectrum, the bandwidth (1000/9) is about 111 Hz at the 3db points, and at the low frequency end of the spectrum the bandwidth (40/9) is about 4 Hz. This permits a faster sweep at the high frequencies because of the increased bandwidth. The frequency sweep ramp from the ramp generator, being an RC discharge, is non-linear. The sweep is conducted as rapidly as possible with acceptable frequency spectrum information.

Figure 6:
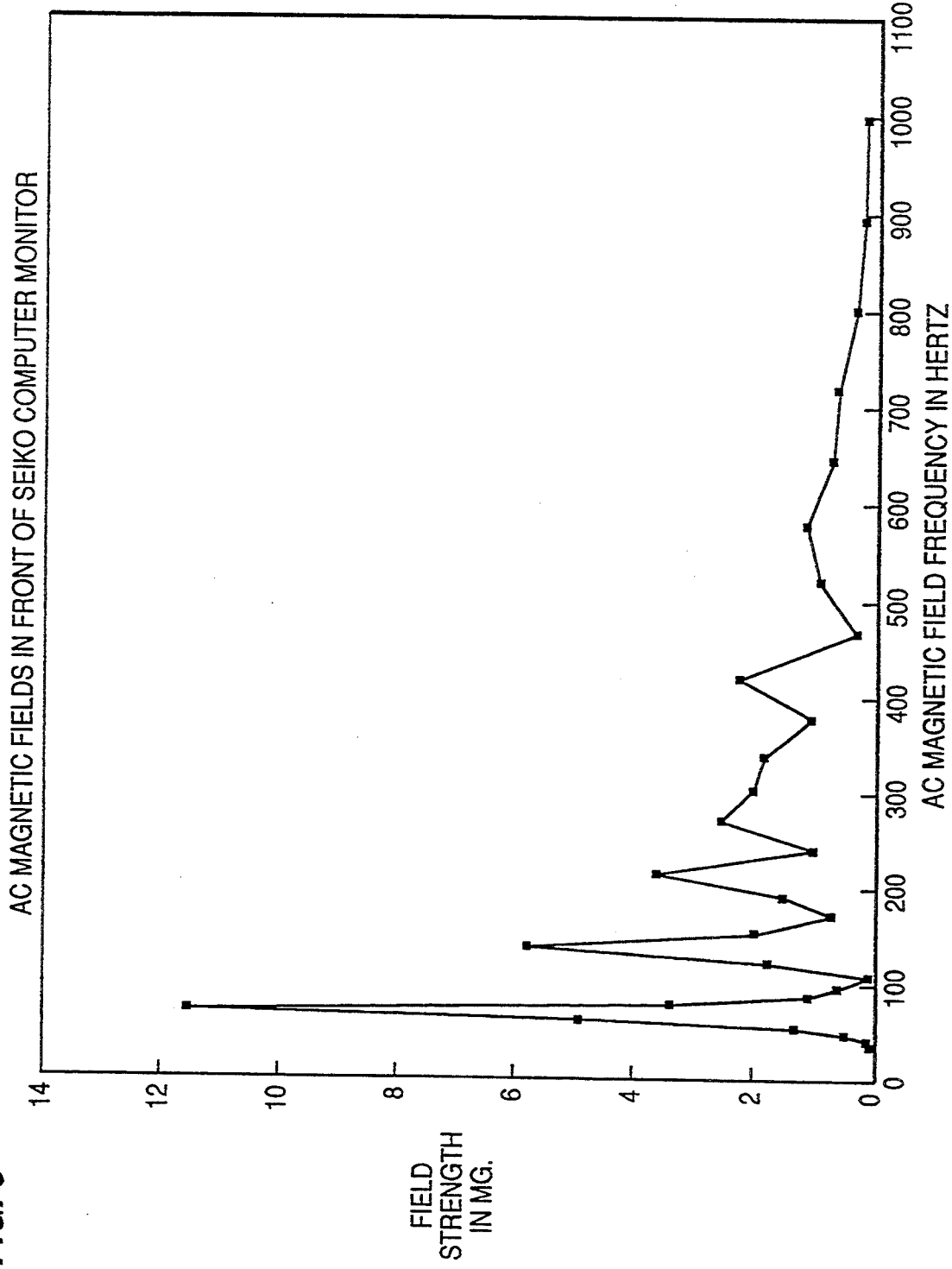

The data stored in the computer may be offloaded and processed in an outside computer, such as a PC (personal computer), for example. Using a program such as LOTUS 123, all pertinent data related to the magnetic field frequencies and energies may be displayed individually and in their respective frequency doses. The total magnetic field strength may be computed as the square root of the sum of the squares of the X, Y and Z axis field strength components. The PC may be programmed to subtract a background spectrum from all other spectra. The PC may be programmed to display, graphically, an entire AC magnetic field spectrum, such as the spectrum shown in FIG. 6 displaying AC magnetic fields in front of a computer monitor, and the spectrum shown in FIG. 7 displaying AC magnetic fields close to a microwave oven.

While a preferred embodiment of the invention has been shown and described, it will be apparent to those skilled in the art that changes can be made in this embodiment without departing from the principles and spirit of the invention, the scope of which is defined in the appended claims.

The invention claimed is:

1. A triaxial AC magnetic field measurement instrument comprising three AC magnetic field sensor means, each sensor means being sensitive to an AC magnetic field component that is orthogonal to each of AC magnetic field components to which the other sensor means are sensitive, said sensor means being a part of three AC magnetic field measurement channels, respectively, to which the sensor means supply AC signals corresponding to the AC magnetic field components, respectively, each channel including bandpass filter means having an input connected to the respective sensor means, means for causing a passband of each filter means to sweep across a predetermined frequency range and to produce an AC output which depends upon the field strength of the respective AC magnetic field component in the passband at different center frequencies, means for converting the AC outputs of said filter means in successive passbands to corresponding magnetic field data capable of being stored, and means for storing the data, whereby the data is available for analysis and display.

2. An instrument according to claim 1, wherein each of said filter means comprises a clock controlled, switched capacitor, bandpass filter means in which the passband center frequency varies with the frequency of a clock signal, and wherein said means for causing the sweeping of the passband comprises a ramp generator means and a voltage controlled oscillator means, said ramp generator means providing a varying voltage input to said voltage controlled oscillator means and said voltage controlled oscillator means providing a varying frequency clock signal to said filter means.

3. An instrument according to claim 2, wherein said ramp generator means comprises an RC network means in which a capacitor is charged to a voltage corresponding to an initial clock signal frequency and is discharged to provide a non-linear voltage ramp.

4. An instrument according to claim 1, wherein each converting means includes a TRMS detector means for converting an AC output to a DC output, and wherein the data stored corresponds to the output of the TRMS detector means.

5. An instrument according to claim 4, wherein the data stored is digital data.

6. In an AC magnetic field measurement instrument, magnetic field sensor means for providing an AC output corresponding to an AC magnetic field to be measured, bandpass filter means having an input connected to the sensor means, means for causing a passband of said filter means to sweep across a predetermined frequency range and to produce AC signals at different passband center frequencies which depend upon the field strength of an AC magnetic field within the passband, means for converting said AC signals in successive passbands to corresponding magnetic field data capable of being stored, and means for storing the data, whereby the data is available for analysis and display.

7. An instrument according to claim 6, wherein the converter means includes TRMS detector means for converting the AC signals to DC signals, and wherein the data stored are digital signals corresponding to the DC signals.

8. An instrument according to claim 6, wherein said filter means comprises a clock controlled, switched capacitor, bandpass filter means in which the passband center frequency varies with the frequency of a clock signal, and wherein said means for causing the sweeping of the passband comprises a ramp generator means and a voltage controlled oscillator means, said ramp generator means providing a varying voltage input to said voltage controlled oscillator means and said voltage controlled oscillator means providing a varying frequency clock signal to said filter means.

9. An instrument according to claim 8, wherein said ramp generator means comprises an RC network means in which a capacitor is charged to a voltage corresponding to an initial clock signal frequency and is discharged to provide a non-linear voltage ramp.

10. An instrument according to claim 1, wherein the storing means stores data from successive passbands that intersect at their 3db rolloff points.

11. An instrument according to claim 10, wherein each filter means has constant Q across the predetermined frequency range so that the bandwidths of successive passbands become progressively narrower as the center frequencies become progressively lower.

12. An instrument according to claim 6, wherein the storing means stores data from successive passbands that intersect at their 3db rolloff points.

13. An instrument according to claim 12, wherein each filter means has constant Q across the predetermined frequency range so that the bandwidths of successive passbands become progressively narrower as the center frequencies become progressively lower.

* * * * *